United States Patent
Goulding et al.

(10) Patent No.: US 10,872,290 B2
(45) Date of Patent: Dec. 22, 2020

(54) NEURAL NETWORK PROCESSOR WITH DIRECT MEMORY ACCESS AND HARDWARE ACCELERATION CIRCUITS

(71) Applicant: Raytheon Company, Waltham, MA (US)

(72) Inventors: John R. Goulding, Tucson, AZ (US); John E. Mixter, Tucson, AZ (US); David R. Mucha, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 629 days.

(21) Appl. No.: 15/711,457

(22) Filed: Sep. 21, 2017

(65) Prior Publication Data
US 2019/0087708 A1   Mar. 21, 2019

(51) Int. Cl.
| | |
|---|---|
| *G06F 17/00* | (2019.01) |
| *G06N 3/04* | (2006.01) |
| *G06F 12/0817* | (2016.01) |
| *G06N 3/063* | (2006.01) |
| *G06N 3/08* | (2006.01) |
| *G11C 11/406* | (2006.01) |
| *G06F 13/28* | (2006.01) |
| *G06F 12/1081* | (2016.01) |

(52) U.S. Cl.
CPC ........... *G06N 3/04* (2013.01); *G06F 12/0824* (2013.01); *G06N 3/063* (2013.01); *G06N 3/082* (2013.01); *G06F 12/1081* (2013.01); *G06F 13/28* (2013.01); *G11C 11/40603* (2013.01)

(58) Field of Classification Search
None
See application file for complete search history.

(56) References Cited

U.S. PATENT DOCUMENTS

| | | |
|---|---|---|
| 3,275,985 A | 9/1966 | Dunn et al. |
| 3,646,329 A | 2/1972 | Yoshino et al. |
| | (Continued) | |

FOREIGN PATENT DOCUMENTS

| | | |
|---|---|---|
| EP | 0636991 A2 | 2/1995 |
| EP | 1186999 B1 | 9/2007 |
| | (Continued) | |

OTHER PUBLICATIONS

"International Application Serial No. PCT/US2018/051486, International Search Report dated Dec. 7, 2018", 5 pgs.

(Continued)

*Primary Examiner* — Cheng Yuan Tseng
(74) *Attorney, Agent, or Firm* — Schwegman Lundberg & Woessner, P.A.

(57) ABSTRACT

A dynamically adaptive neural network processing system includes memory to store instructions representing a neural network in contiguous blocks, hardware acceleration (HA) circuitry to execute the neural network, direct memory access (DMA) circuitry to transfer the instructions from the contiguous blocks of the memory to the HA circuitry, and a central processing unit (CPU) to dynamically modify a linked list representing the neural network during execution of the neural network by the HA circuitry to perform machine learning, and to generate the instructions in the contiguous blocks of the memory based on the linked list.

20 Claims, 4 Drawing Sheets

(56) References Cited

U.S. PATENT DOCUMENTS

| | | | |
|---|---|---|---|
| 4,504,970 | A | 3/1985 | Werth et al. |
| 4,541,115 | A | 9/1985 | Werth |
| 4,550,431 | A | 10/1985 | Werth et al. |
| 4,727,505 | A | 2/1988 | Konishi et al. |
| 4,748,674 | A | 5/1988 | Freeman |
| 4,912,649 | A | 3/1990 | Wood |
| 4,912,651 | A | 3/1990 | Wood et al. |
| 4,912,652 | A | 3/1990 | Wood |
| 4,912,654 | A | 3/1990 | Wood |
| 4,912,655 | A | 3/1990 | Wood |
| 4,941,122 | A | 7/1990 | Weideman |
| 4,951,239 | A | 8/1990 | Andes et al. |
| 4,994,982 | A | 2/1991 | Duranton et al. |
| 5,052,043 | A | 9/1991 | Gaborski |
| 5,226,092 | A | 7/1993 | Chen |
| 5,274,714 | A | 12/1993 | Hutcheson et al. |
| 5,283,838 | A | 2/1994 | Togawa et al. |
| 5,423,040 | A | 6/1995 | Epstein et al. |
| 5,517,598 | A | 5/1996 | Sirat |
| 5,590,218 | A | 12/1996 | Ornstein |
| 5,611,020 | A * | 3/1997 | Bigus .................. G06N 3/04 706/25 |
| 5,615,307 | A | 3/1997 | Bigus |
| 5,644,784 | A | 7/1997 | Peek |
| 5,796,925 | A | 8/1998 | Deville |
| 5,924,098 | A | 7/1999 | Kluge |
| 5,946,674 | A * | 8/1999 | Nordin .................. G06N 20/00 706/13 |
| 6,493,686 | B1 * | 12/2002 | Francone ............... G06N 20/00 706/12 |
| 6,782,465 | B1 | 8/2004 | Schmidt |
| 8,121,968 | B2 * | 2/2012 | Eaton ................. G06K 9/00335 706/46 |
| 8,442,667 | B2 | 5/2013 | Pannese |
| 8,639,365 | B2 * | 1/2014 | Pannese ............... G06F 16/248 700/28 |
| 9,015,086 | B2 * | 4/2015 | Heidasch ............... G06N 3/084 706/13 |
| 10,409,614 | B2 * | 9/2019 | Ould-Ahmed-Vall ...................... G06F 9/3851 |
| 10,438,132 | B2 * | 10/2019 | Duggan ................. G06N 20/00 |
| 10,439,886 | B2 * | 10/2019 | Lapiotis ............... H04L 41/145 |
| 10,452,976 | B2 * | 10/2019 | Yoo .......................... G06N 3/08 |
| 10,467,528 | B2 * | 11/2019 | Golovashkin .......... G06N 3/082 |
| 2008/0208372 | A1 | 8/2008 | Pannese |
| 2016/0335537 | A1 * | 11/2016 | Spagnola ................. G06N 3/02 |
| 2017/0011288 | A1 | 1/2017 | Brothers et al. |
| 2017/0091883 | A1 * | 3/2017 | Greystoke .......... G06Q 30/0619 |
| 2018/0046903 | A1 * | 2/2018 | Yao ........................ G06N 3/082 |
| 2018/0293492 | A1 * | 10/2018 | Kalamkar ............ G06N 3/0454 |

FOREIGN PATENT DOCUMENTS

| | | |
|---|---|---|
| WO | WO-2018185763 A1 | 10/2018 |
| WO | WO-2019060290 A1 | 3/2019 |

OTHER PUBLICATIONS

"International Application Serial No. PCT/US2018/051486, Written Opinion dated Dec. 7, 2018", 7 pgs.

Ahn, Byungik, "Special-Purpose Hardware Architecture for Neuromorphic Computing", International SoC Design Conference (ISOCC), (2015), 209-210.

Baker, Robert, "Recent Advances in Astrodynamics 1960", ARS Journal, vol. 30, No. 12, (1960), 1127-1140.

Dreyfus, Stuart, "The Numerical Solution of Variational Problems", Journal of Mathematical Analysis and Applications 5, (1962), 30-45.

Duranton, M, et al., "A General Purpose Digital Architecture for Neural Network Simulations", First IEEE International Conference on Artificial Neural Networks, (Conf. Publ. No. 313), (1989), 62-70.

Gabriel, Weisz, et al., "A Study of Pointer-Chasing Performance on Shared-Memory Processor-FPGA Systems", Proceedings of the 2016 ACM/SIGDA International Symposium on Field-Programmable Gate Arrays, FPGA '16, XP055526733, New York, New York, USA DOI: 10.1145/2847263.2847269 ISBN: 978-1-4503-3856-1 p. 1-p. 10, left-hand column, paragraph 2, (Feb. 21, 2016), 264-273.

Kelley, Henry, "Gradient Theory of Optimal Flight Paths", ARS Journal. 30 (10), (1960), 947-954.

Linnainmaa, Seppo, "Taylor expansion of the accumulated rounding error", BIT Numerical Mathematics. 16 (2), (1976), 146-160.

Maurice, Peemen, et al., "Memory-centric accelerator design for Convolutional Neural Networks", 2013 IEEE 31st International Conference on Computer Design (ICCD),, (Oct. 1, 2013), 1-19.

Mirchandani, Gagan, "Scheduling and Simulation of Neural Nets on DSP Accelerator", International Conference on Acoustics, Speech, and Signal Processing, (1990), 1771-1774.

Norman, P Jouppi, et al., "In-Datacenter Performance Analysis of a Tensor Processing Unit", Proceedings of the 44th Annual International Symposium on Computer Architecture , ISCA '17, ACM Press, New York, New York, USA (Jun. 24, 2017), 1-12.

Norton, Mark, "Simulating Neural Networks Using C*", Proceedings., 2nd Symposium on the Frontiers of Massively Parallel Computation., (1988), 203-205.

Rumelhart, et al,, "Learning Representations by Back-Propagating Errors", In the Journal of Nature, vol. 323, (Oct. 9, 1986), 533-536.

Schmidhuber, Jürgen, "Deep Learning in Neural Networks: An Overview", Technical Report IDSIA The Swiss AI Lab IDSIA, (Oct. 8, 2014), 88 pgs.

Wan; Eric, "Time Series Prediction by Using a Connectionist Network with Internal Delay Lines"; Santa Fe Institute Studies in the Sciences of Complexity—Proceedings, (1993), 22 pgs.

Werbos, Paul, "Applications of advances in nonlinear sensitivity analysis", System modeling and optimization; (1982), 762-770.

* cited by examiner

NEURAL NETWORK PROCESSOR WITH DIRECT MEMORY ACCESS AND HARDWARE ACCELERATION CIRCUITS

TECHNICAL FIELD

Embodiments generally relate to neural networks, and more particularly to neural network processors with direct memory access and hardware acceleration circuits.

BACKGROUND

An artificial neural network (ANN) is a computational system including a large collection of simple neural units or processing elements (PEs) interconnected together. The connections of PEs can be modeled after the network of neurons in a biological brain. ANNs are typically intended to solve problems in a manner similar to that of biological brains, and are typically trained to solve problems using a technique known as machine learning. A deep neural network (DNN) is an ANN with multiple hidden layers of PEs between an input layer of PEs and an output layer of PEs. DNNs have the potential to model complex data using fewer PEs than a similarly performing shallow network. DNNs may be used to classify vehicles in electro-optical (EO) or synthetic aperture radar (SAR) imagery or perform other image recognition applications that require a high ratio of memory access due to their high connectivity.

DETAILED DESCRIPTION

The following description and the drawings sufficiently illustrate specific embodiments to enable those skilled in the art to practice them. Other embodiments may incorporate physical, functional, logical, electrical, process, cost, and other changes. Portions and features of some embodiments may be included in, or substituted for, those of other embodiments. Embodiments set forth in the claims encompass all available equivalents of those claims.

An ideal implementation of an ANN in hardware may include a network of PE's with weight values associated with the interconnections between the PE's stored in a local memory. The PE's computations may be performed and the results stored locally. Due to the capacity limitations of current hardware solutions (e.g., field programmable gate arrays (FPGAs)) the functional capabilities of ANN's implemented in this fashion are greatly limited. For various applications, it is desirable to implement ANNs on a larger scale than achievable via purely a local network of PEs and local memory. In various embodiments, an ANN may be configured in a non-local memory, converted into a stream of computer instructions, transferred to local processing circuitry (e.g., an FPGA), and executed entirely within the local processing circuitry. The local processing circuitry may include special purpose hardware accelerator circuits (AC) and static random access memory (SRAM) to reduce both training and execution time of the ANN. Direct memory access (DMA) may be used to move data from the non-local memory (e.g., dynamic random access memory (DRAM)) to the AC to reduce computational burden on a CPU. The CPU may be part of a low size, weight, and power (low-SWaP) system on chip (SoC) implementation incorporating the CPU, FPGA, on-chip SRAM, and external DRAM for training and execution of DNNs.

Figure 1A:
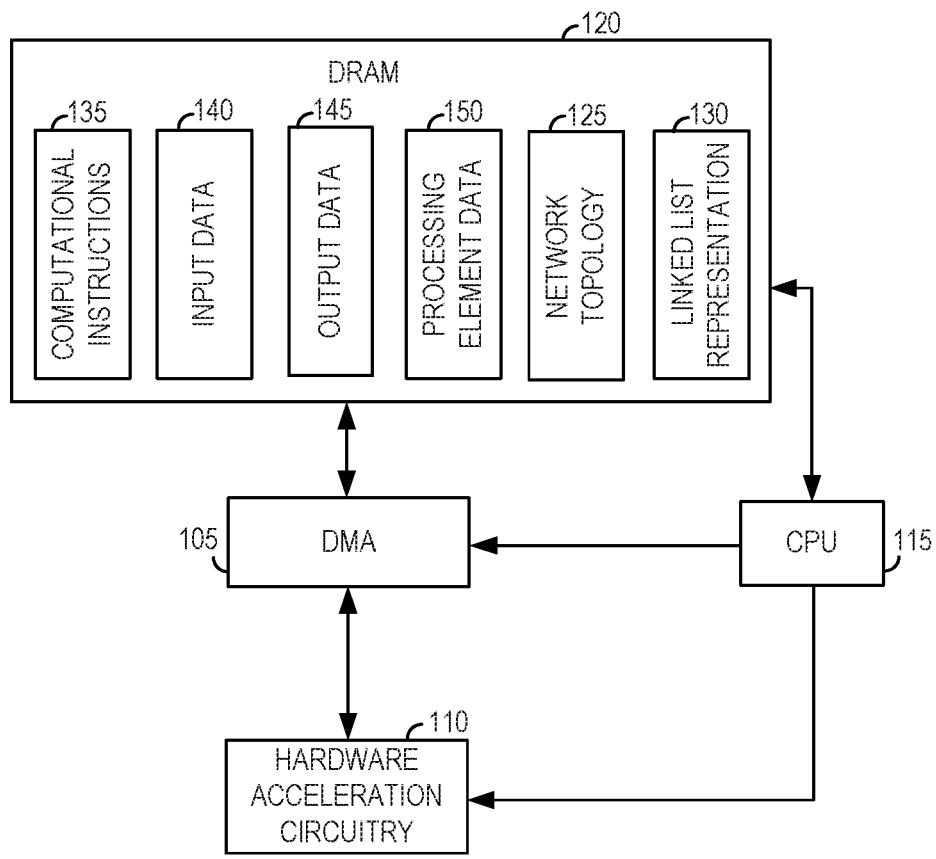
FIG. 1A is a block diagram that illustrates a neural network processing unit with direct memory access and hardware acceleration circuitry, in accordance with some embodiments.
Figure 1B:
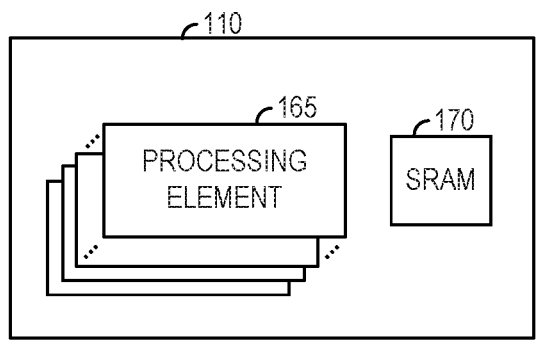
FIG. 1B is a block diagram that illustrates components of the hardware acceleration circuitry illustrated in FIG. 1A, in accordance with some embodiments.
Figure 1C:
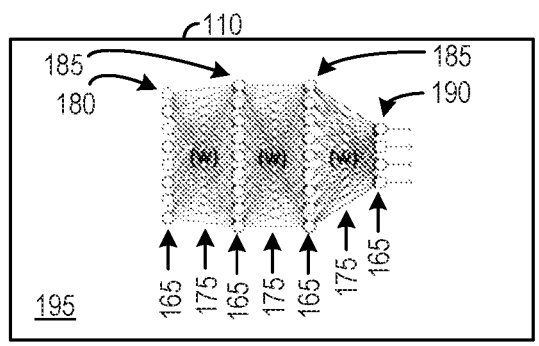
FIG. 1C is a block diagram that illustrates a deep neural network executed in the hardware acceleration circuitry of FIG. 1A, in accordance with some embodiments.

FIG. 1A is a block diagram that illustrates a neural network processing unit (NNPU) 100 with direct memory access (DMA) circuitry 105 and hardware acceleration (HA) circuitry 110, in accordance with some embodiments. FIG. 1B is a block diagram that illustrates components of the HA circuitry 110 illustrated in FIG. 1A, in accordance with some embodiments. FIG. 1C is a block diagram that illustrates a deep neural network (DNN) 195 executed in the HA circuitry of FIG. 1A, in accordance with some embodiments. A central processing unit (CPU) 115 may control the NNPU 100 including the DMA circuitry 105, the HA circuitry 110, and DRAM 120. In various embodiments, the CPU 115 may include various types of computational processing units (e.g., graphics processing units (GPUs), microcontrollers, or the like). In various embodiments, other forms of memory circuitry may be used instead of, or in addition to, the DRAM 120, for example, SRAM, flash memory, nonvolatile random access memory (NVRAM), nonvolatile memory (NVM), or the like.

The CPU 115 may generate an original network topology for a neural network and store the original network topology in the DRAM 120 as a network topology 125. The network topology 125 may represent a fully formed neural network based on parameters that describe the network architecture. The CPU 115 may represent the network topology 125 as a multi-level linked list representation 130. The multi-level linked list representation 130 may facilitate the CPU 115 to efficiently create and modify the linked list representation 130 to represent the neural network topology 125 and convert the network topology 125 into a stream of computational instructions 135 for transmission to the HA circuitry 110. The linked list representation may be converted by the CPU 115 into a set of computational instructions 135 in the DRAM 120. The CPU 115 may control the DMA circuitry 105 to transfer the network topology 125 from the DRAM 120 to the HA circuitry 110 based on at least one of the linked list representation 130 and the computational instructions 135.

The linked list representation 130 may facilitate dynamic adaptation of the neural network topology 125 and parameters in the DRAM 120 by the CPU 115. The CPU 115 may dynamically add, subtract, and/or change neurons, connections, and/or weights associated with the neural network in the linked list representation 130, such as to perform machine learning.

In practice, the linked list representation 130 may include three separate linked lists. A first linked list may include a multiply-linked list representing the neural network architecture, which may be converted into a sequential array of neural instructions to be moved from the DRAM 120 to the HA circuitry 110. The sequential array of neural instructions may be organized into sequential chunks to be processed in parallel by PEs 165 of the HA circuitry 110. Input data and parameters may also be organized into sequential chunks for efficient transfer to the HA circuitry 110 by the DMA circuitry 105.

A second linked list may be created at, after, or around the time the sequential array of neural instructions is created. The second linked list may include a single link to notify the DMA circuitry 105 of a memory location from which to begin transferring data to the HA circuitry 110 for forward propagation of the neural network. The second linked list may be used to move the entire block of sequential array of neural instructions to the HA circuitry 110.

A third linked list may include a starting memory address for each layer of the neural network. The third linked list may be in reverse order because backward propagation is performed from the last layer to the first layer of the neural network. Using the three linked lists, a well-ordered sequential neural instruction array may be created, thereby gaining an increase in efficiency. The linked lists may not need to be pruned or modified until after a training cycle, using the HA circuitry 110, is performed. The sequential arrays based on the linked lists may not be modified unless the linked lists are modified.

The linked list representation 130 may include memory locations for input/output, network parameters (e.g., weights and connections), and routing and HA circuitry operation data. The linked list representation 130 may organize the input/output data, network parameters, routing, and/or HA circuitry operation data to efficiently orchestrate and/or control the DMA circuitry 105 via pseudocode for the data flow from the DRAM 120 to the HA circuitry 110 to implement the neural network topology 125.

The linked list representation 130 may also facilitate background machine learning by the CPU 115 in conjunction with the DRAM 120 while the HA circuitry 110 executes the neural network in real-time. While the data from the external DRAM 120 is transferred into and out from the HA circuitry 110 by the DMA circuitry 105 during execution of the DNN 195 by the HA circuitry 110, the neural network data and results may remain in the DRAM 120, such as for machine learning to be performed by the CPU 115. In this way, overall system speed may be improved while overall system power consumption is reduced. In addition, during execution of the DNN 195 by the HA circuitry 110, intermediate results in the HA circuitry 110 may be transferred to the external DRAM 120 by the DMA circuitry 105 to facilitate machine learning using the latest results from execution of the DNN 195 by the HA circuitry 110. Execution of the DNN 195 by the HA circuitry 110 and transferring of data between the DRAM 120 and the HA circuitry 110 may be coordinated with one another.

The HA circuitry 110 may include a plurality of PEs 165 and local SRAM 170. In various embodiments, other forms of memory circuitry may be used instead of or in addition to the SRAM 170, for example, DRAM, flash memory, NVRAM, nonvolatile memory (NVM), or the like. In some embodiments, the SRAM 170 of the HA circuitry 110 may be partitioned into sections for data and for neural network parameters, and the DMA circuitry 105 may include two separate DMA engines, one for pipelining data transfer for each of the data section and neural network parameters section of the SRAM 170.

In an embodiment, the PEs 165 may include a Widrow's adaptive linear combiner, in which the output $y_k$ where k represents a discrete time may be represented by Equation 1 as follows:

$$y_k = \Sigma_{l=0}^{L} w_{lk} x_{lk} = W_k^T x_k \tag{Eq. 1}$$

where L is the maximum number of weights w. In an embodiment, the PEs 165 may include a perceptron as a simple neural processor. The perceptron may include a Widrow's adaptive linear combiner followed by threshold-based switch to make a decision regarding the data input to the perceptron. In an embodiment, threshold-based switch may include a simple on/off threshold β such that an output is TRUE, 1, or high if $y_k > \beta$ and FALSE, 0, or low otherwise. In an embodiment, the threshold-based switch may include a nonlinear function (e.g., a sigmoid, a rectified linear unit (ReLU) function, a diode function, or other function).

The PEs 165 in the HA circuitry 110 may perform a forward propagation of the network topology 125 according to the network topology 125 transferred by the DMA circuitry 105 from the DRAM 120 to the HA circuitry 110 based on at least one of the linked list representation 130 and the computational instructions 135. Each of the PEs 165 in a first or input layer 180 may receive an input from one or more external sources, and multiply the input by a weight factor. The weight factor may be different for each of the inputs. The weight factors for all the PEs 165 may be stored in the DRAM 120 as processing element data 150, and may be transferred to the HA circuitry 110 to be stored in the SRAM 170. The PEs 165 within the input layer 180 may then work in parallel to perform a computation on the weighted inputs and output a result. How the PEs 165 perform the computation may depend upon the form of the PEs 165. Each of the PEs 165 in the second and subsequent hidden layers 185 and the final or classifier layer 190 of the DNN 195 illustrated in FIG. 1C may receive an input from one or more PEs 165 of a prior hidden layer 185 or the input layer 180, and multiply the input by a weight factor 175. The weight factor 175 may be different for each of the inputs, and may be stored in the SRAM 170. The PEs 165 may then perform a computation on the weighted inputs and output a result. All the PEs 165 of the second layer 185 may wait for all the PEs 165 of the input layer 180 to complete their computations prior to beginning computation. Likewise, each of the subsequent layers 185 may wait for all the PEs 165 of its immediately prior layer 185 to complete prior to beginning computation. In this way, the PEs 165 of each layer of the network topology 125 implemented in the HA circuitry 110 may operate in parallel. The CPU 115 may control the DMA 105 to transfer the computational results of the PEs 165 to the DRAM 120 to be stored in the output data 145 and/or the processing element data 150 after the computations of each layer 180, 185, 190 are complete. The CPU 115 may also control the DMA 105 to transfer the results of the classifier layer 190 to the DRAM 120 to be stored in the output data 145 after the PEs 165 of the classifier layer 190 complete their computations.

In some embodiments, the HA circuitry 110 may include enough PEs 165 to implement a single layer 180, 185, 190 of the DNN 195 at a time, and the SRAM 170 may include weight data for the PEs 165 of each layer 180, 185, 190 of the DNN 195 as well as input and output registers to permit the PEs 165 to step through each of the layers of the DNN 195 from the input layer 180 to the classifier layer 190 while the PEs 165 read input data from the SRAM 170 and write output data to the SRAM 170 corresponding to each layer of the DNN 195 as the HA circuitry 110 steps through each of the layers of the DNN 195 in sequence. In this way, fewer PEs 165 may be required to execute the DNN 195, and the number of layers of the DNN 195 may not be limited by a number of PEs 165 included in the HA circuitry 110. In addition, by not writing output data to the DRAM 120 after processing by each layer 180, 185 is complete and by not reading input data from the DRAM 120 at the start of processing by each layer 185, 190, efficiency is increased and power consumption is reduced. For example, power consumption may be reduced by up to or even over a factor of 100 by saving intermediate data in local SRAM 170 vs. in the DRAM 120. In various embodiments, the data in the SRAM 170 may be stationary while the parameters of the DNN 195 cycle through the data.

In a training mode, after the PEs 165 have completed a forward propagation through the network topology 125, the CPU 115 may analyze the output data 145 to determine whether a backward propagation through the network topology 125 is to be performed. If the backward propagation is determined to be performed, the CPU 115 may control the DMA 105 to transfer modified weights associated with each of the PEs 165 stored in the SRAM 170 to the processing element data 150 of the DRAM 120 as the computations of each layer 180, 185, 190 of the network topology 125 represented in the HA circuitry 110 is completed.

After a cycle of training is completed, the CPU 115 may modify a structure of the network topology 125 based on the output values of each of the PEs 165 stored in the output data 145 and/or modified weights stored in the processing element data 150. After modifying the network topology 125, the CPU 115 may convert the modified network topology 125 into a modified linked list representation 130 and/or modified computational instructions 135, and continue training the neural network represented by the network topology 125 using the input data 140.

After the training of the neural network represented by the network topology 125, is determined to be complete, the NNPU 100 may be used to operate purely in an execution mode. During the training mode, the execution mode is a subset of the training mode. In the execution mode, outside the context of the training mode, a backward propagation may not be performed. After execution of the neural network in the NNPU 100 from the input layer 180 through to the classifier layer 190, the CPU 115 may analyze the output data 145 to determine a prediction. For example, based on an input image represented by the input data 140 and the network topology 125 and processing element data 150 determined according to training the neural network in the NNPU 100 to recognize a vehicle of a certain type, the CPU 115 may analyze the output data 145 to determine whether the input image represented by the input data 140 includes an image of a vehicle of the certain type.

The instruction streams facilitate acceleration of neural network execution by the NNPU 100 through facilitating parallelization of processing by the PEs 165. The computational instructions 135 may have four fields, identified below:

OPCODE—determines the function of the PE 165
ADDRESS—determines where the PE 165 will load operands and store results
DATA—Contains additional PE operands
BUFFER_SELECT—Determines which PE buffer contains the input operands (PE buffer may be included in the SRAM 170)

The instruction set used for the OPCODE may be one of the following:

SET_LAYER_TYPE—Input, Convolution, Classifier, etc.
SET_VALUE—Used to initialize a hardware register
SET_BIAS—Indicates that the value in the instruction is a bias
LOAD—Indicates that the value in the instruction is an operand
STORE—Instructs the PE 165 to store its result in the address specified by the instruction
MAP_DONE—Indicated when a convolution map ends A set of computational instructions 135 corresponding to a neural network may begin with a header that includes several SET_VALUE opcodes. These instructions may set hardware registers with values used for forward and backward propagation. After the header, a SET_LAYER_TYPE instruction may provide the PEs 165 information regarding what type of layer is to be executed. The SET_LAYER_TYPE instruction may be followed by one SET_BIAS instruction and a LOAD instruction for each connection to be processed by the PE 165. Depending on the layer type, the set of instructions for the layer may conclude with a STORE or a MAP_DONE instruction.

The CPU 115 may organize data (e.g., all data) between SET_LAYER_TYPE opcodes, such as to help ensure there are no data dependencies. This ordering facilitates the CPU 115 to then divide the set of computational instructions 135 into a plurality of instruction streams, one for each PE 165. The PEs 165 may operate in parallel, each having its own input buffer, and each storing its results in its own output buffer. After the entire layer has been processed, the output buffers corresponding to the PEs 165 may be combined to form a complete layer output.

The PEs 165 may receive the instruction streams and apply the received instructions to data in their respective input buffers. The results of the instruction execution may be stored in the respective output buffers of the PEs 165. After a layer has been fully executed, the collective output buffer for the layer may become the collective input buffer for the next layer. Selection of the input and output buffers for a layer may be determined by the CPU 115 using the BUFFER_SELECT field of the SET_LAYER_TYPE instruction. By alternating the input and output buffers of the layers of the neural network, the data operands from previously computed layers may be stored local to corresponding PEs 165. This local storage increases efficiency and processing throughput while decreasing power consumption. Each PE 165 may also have an additional buffer dedicated to storing error computations which may be used during backward propagation.

The PEs 165 may process the instruction streams using pipelined logic and math functions. Each instruction may be processed in the order in which it is received. Simple opcodes may be processed in a single clock cycle, while more complex opcodes, including those requiring mathematical computations, may be processed in multiple clock cycles. Computational behavior of a PE 165 may depend upon its received instruction and the PE's selected operating mode (forward or backward propagation), which is determined by the CPU 115 via a memory-mapped register setting.

To ensure data coherency, the PEs 165 may also include logic for synchronizing the start of computation of each layer of the neural network. When a PE 165 receives the SET_LAYER_TYPE instruction, it may halt operation until all PEs 165 receive the same instruction. In this way, all PEs 165 may complete processing of the current layer and store results in their respective output buffers before starting computation of the next layer.

The DMA circuitry 105 is responsible for transferring the instruction streams to the PEs 165. By the CPU 115 generating the instruction streams and storing them as computational instructions 135 in contiguous blocks of data in the DRAM 120, the DMA circuitry 105 may include a traditional DMA engine to transfer the instructions streams from the DRAM 120 to the PEs 165. For example, the DMA circuitry 105 may include a descriptor-based DMA engine operating in block transfer mode.

Each PE 165 or group of PEs 165 may use a dedicated DMA engine responsible for feeding instruction streams to the PE 165 or group of PEs 165. Therefore, while one DMA circuitry 105 block is illustrated in FIG. 1A, the DMA circuitry 105 may include a plurality of dedicated DMA engines for different PEs 165 or groups of PEs 165. After the CPU 115 generates and stores the PE instruction streams as the computational instructions 135 of the DRAM 120, it may then generate DMA descriptors for each dedicated DMA engines for different PEs 165 or groups of PEs 165 and initiate the instruction stream DMA transfers.

Groups of PEs 165 may be included in the HA circuitry 110 in combination with bus interconnect data widths that are sufficiently wide to support multiple, parallel PE instructions. When groups of PEs 165 are utilized, the CPU 115 may interleave the individual PE instruction streams (one per PE 165) into a single, contiguous instruction stream which can be transferred in the same manner as an individual PE instruction stream. Each PE 165 in a group of PEs 165 may therefore receive PE instructions in parallel with other PEs 165 in the same group of PEs 165.

The PEs 165 may include additional, dedicated DMA logic for transferring results back to the DRAM 120 after instruction stream computations are completed. Each PE 165 may be programmed with a memory address according to the DATA field of the SET_LAYER_TYPE instruction in its respective instruction stream originally generated by the CPU 115, and the PE's processing results may transferred to this location in the DRAM 120 as the PE's computations are completed during each layer's forward and backward propagation process. Thus, a different memory address may be set for each layer's processing. During backward propagation, the PE instruction stream may be overwritten in memory space within the DRAM 120 that is currently being processed. This overwriting of memory may be beneficial to overall system throughput and efficiency of the NNPU 100.

Forward propagation of the neural network in the HA circuitry 110 may begin when the CPU 115 triggers the DMA circuitry 105 to begin the instruction stream transfer from the DRAM 120 to the HA circuitry 110. As each PE 165 receives instructions, they may be decoded and executed. The first instructions received and processed by the PEs 165 may be the SET_VALUE instructions. These instructions set the learning rate and the activation functions of the PE 165. After the SET_VALUE instructions, the PE 165 may receive and process the SET_LAYER_TYPE instruction, which indicates the type of layer along with which memory buffer will serve as the input to the PE 165.

Next, the PE 165 may receive and process LOAD instructions, which pass weight values along with the memory address of the input data for the PE 165 to read in and process. The PE 165 may sum the product of the weight value with the data from the input buffer for all LOAD instructions.

When the PE 165 receives a STORE or MAP_DONE instruction, the sum may be applied to the activation function and the result may be stored in the PE's output buffer at the address specified by the STORE or MAP_DONE instruction.

Once all of the PEs 165 have completed processing of their current layer, their respective output buffers may be combined. If the NNPU 100 is in the training mode, the combined layer may be transferred into the DRAM 120. The NNPU 100 may then change the designation of the combined output buffer to the combined input buffer for processing the next layer, unless the classifier layer 190 was the most recently processed layer. If the most recently processed layer was the classifier layer 190, the CPU 115 may analyze the combined output buffer stored in the output data 145 to determine if backward propagation should be performed, or whether the CPU 115 should generate a prediction based on the analysis of the combined output buffer of the classifier layer 190.

When backward propagation is performed, it may begin with the classifier layer 190. The CPU 115 may calculate an error present in the classifier layer 190 and then initiate forward propagation beginning at the input layer 180. The forward propagation may halt at the layer 185 immediately prior to the classifier layer 190 (e.g., classifier layer-1). The output buffer corresponding to the layer 185 immediately prior to the classifier layer 190 (e.g., classifier layer-1) may include data for calculating an adjustment to the weights of the classifier layer 190. After the weights of the classifier layer 190 have been adjusted, the weights may be transferred to the DRAM 120 and the CPU 115 may initiate forward propagation from the input layer 180 to layer immediately prior to the last layer at which the prior forward propagation halted (e.g., two layers 185 prior to the classifier layer 190, or classifier layer-2). The error for the layer immediately prior to the classifier layer 190 (e.g., classifier layer-1) may be calculated using the output data of the layer 185 that is two layers 185 prior to the classifier layer 190 (e.g., classifier layer-2). The weights of the layer immediately prior to the classifier layer 190 (e.g., classifier layer-1) may be adjusted and transferred to the DRAM 120. This process may be performed a total of N−1 times, where N is the total number of layers from the input layer 180 to the classifier layer 190, until the classifier layer-n=the input layer 180, where n ranges from 1 to N−1. The weights of the input layer 180 may not be adjusted, and backward propagation may be considered complete at that point.

Figure 2:
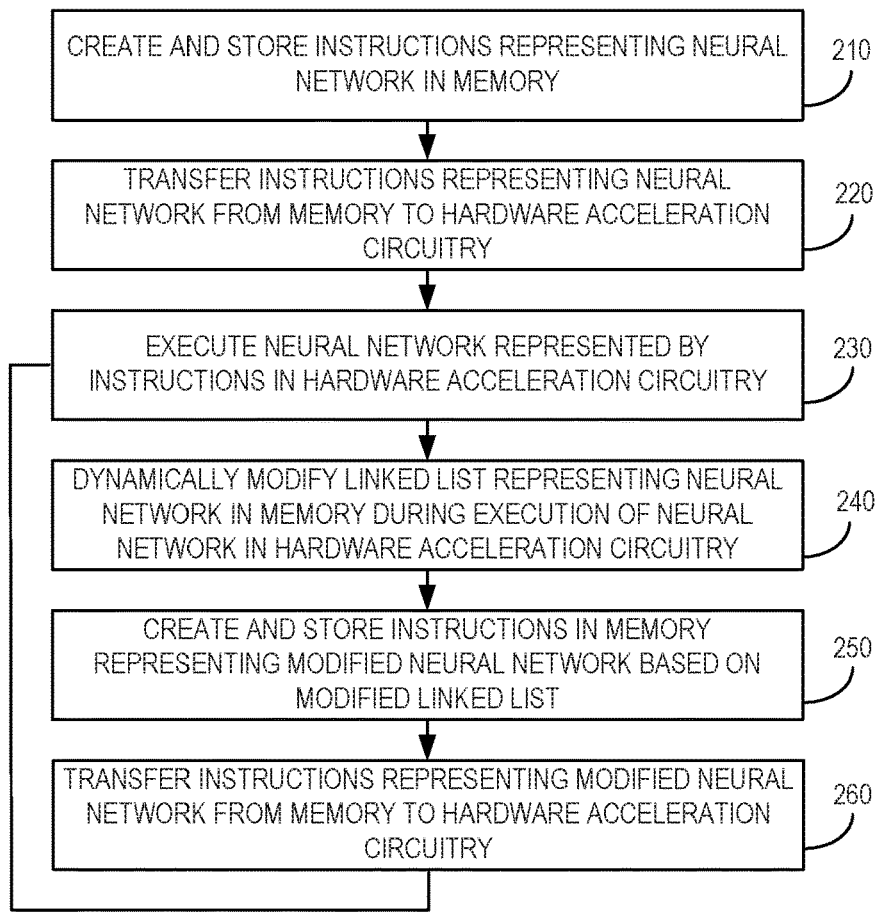
FIG. 2 is a block diagram that illustrates a method of performing neural network processing with direct memory access and hardware acceleration, in accordance with some embodiments.

FIG. 2 is a block diagram that illustrates a method 200 of performing neural network processing with direct memory access and hardware acceleration, in accordance with some embodiments. The method 200 may be performed by a neural network processing unit (NNPU) 100 described above with reference to FIGS. 1A-1C.

In an operation 210, instructions representing a neural network may be created and stored in a memory, for example, the DRAM 120. The instructions may be created by the CPU 115 according to the network topology 125, which may be stored in the DRAM 120 as a linked list representation 130. The instructions may be stored in contiguous blocks of memory within the DRAM 120 for efficient processing and transfer to the HA circuitry 110 by the DMA 105.

In an operation 220, the instructions representing the neural network may be transferred from the memory to hardware acceleration (HA) circuitry by direct memory access (DMA) circuitry. For example, the computational instructions 135 representing the network topology 125 may be transferred from the DRAM 120 to the HA circuitry 110 by the DMA circuitry 105. In various embodiments, the computational instructions 135 representing a modified network topology 125 and/or a modified linked list representation 130 of the network topology 125 may be transferred to the HA circuitry 110 while the HA circuitry 110 is executing the neural network represented by the network topology 125 or a prior version of the network topology 125 prior to the modifications to the network topology 125 and/or the linked list representation 130. The transferring may be according to read/write instructions for the DMA circuitry 105, which may be included in the linked list representation 130.

The transferring of the instructions representing the neural network from the memory to the HA circuitry 110 by DMA circuitry 105 may include converting the linked list representation 130 into a sequential array of neural instructions and/or data, e.g., the computational instructions 135 stored in contiguous blocks of the DRAM 120, and transferring the computational instructions 135 from contiguous blocks of the DRAM 120 to the HA circuitry 110.

In an operation 230, the HA circuitry may execute the neural network represented by the instructions transferred to the HA circuitry by the DMA circuitry. For example, the HA circuitry 110 may execute the neural network represented by the computational instructions 135 transferred to the HA circuitry by the DMA circuitry 105. The execution of the neural network may include organizing the instructions into a sequential array of neural instructions and/or data into a plurality of sequential blocks. For example, the CPU 115 may organize the computational instructions 135 into contiguous blocks of data within the DRAM 120. The execution of the neural network may also include processing, in parallel, the plurality of sequential blocks of the sequential array of neural instructions and/or data by a plurality of parallel processing elements of the HA circuitry. For example, the PEs 165 of each layer 180, 185, 190 of the DNN 195 may process sequential blocks of the computational instructions 135 in parallel, and each layer may begin processing after the prior layer completes processing. The execution of the neural network may also include storing results of executing one layer of the neural network, by the HA circuitry 110, to be input to a next layer of the neural network in memory circuitry within or local to the HA circuitry 110, for example, SRAM circuitry 170.

In an operation 240, a linked list representing the neural network in a memory may be modified during execution of the neural network by the HA circuitry, for example, to perform machine learning and/or training of the neural network. For example, the linked list representation 130 of the DNN 195 in the DRAM 120 may be modified by the CPU 115 during execution of the DNN 195 by the HA circuitry 110 to perform machine learning and/or training of the DNN 195. The linked list may include read/write instructions for the DMA circuitry, and modifying the linked list may include modifying the read/write instructions for the DMA circuitry.

In an operation 250, instructions in memory representing the modified neural network based on the modified linked list may be created and stored. For example, the computational instructions 135 may be generated by the CPU 115 and stored in the DRAM 120 in contiguous blocks of memory based on the linked list representation 130.

In an operation 260, the instructions representing the modified neural network may be transferred from the memory to the HA circuitry by the DMA circuitry. For example, the computational instructions 135 representing the modified network topology 125 may be transferred from the DRAM 120 to the HA circuitry 110 by the DMA circuitry 105. The operations 230-260 may then be repeated until training or execution of the neural network is complete.

Figure 3:
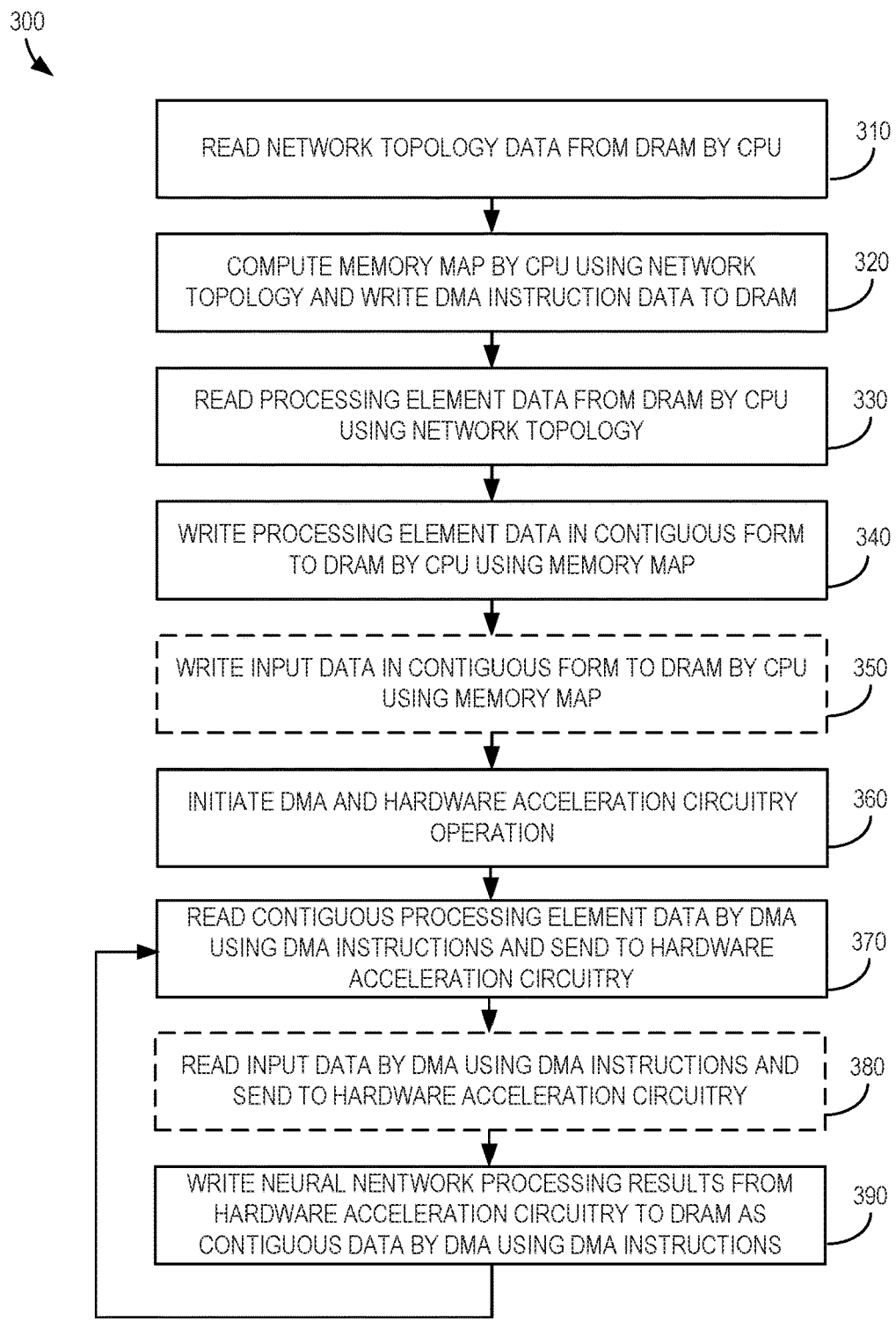
FIG. 3 is a block diagram that illustrates a method of performing neural network processing with direct memory access and hardware acceleration, in accordance with some embodiments.
Figure 4:
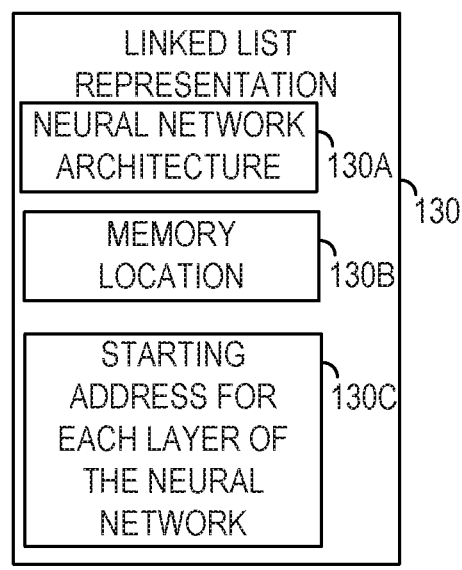
FIG. 4 is a block diagram that illustrates a multi-level linked list representation.

FIG. 3 is a block diagram that illustrates a method 300 of performing neural network processing with direct memory access and hardware acceleration, in accordance with some embodiments. The method 300 may be performed using the neural network processing unit 100 described above with reference to FIGS. 1A-1C.

In an operation 310, the CPU 115 may read neural network topology data 125 from DRAM 120. The neural network topology data 125 may include information regarding neural network nodes, connections between neural network nodes, etc.

In an operation 320, using the neural network topology data 125, the CPU 115 may compute a memory map and write DMA read/write instructions to the DRAM 120. The DMA read/write instructions may be included in the computational instructions 135. The DMA read/write instructions may be written to the DRAM 120 as a linked list representation 130.

In an operation 330, using the neural network topology data 125, the CPU 115 may read processing element data 150 from the DRAM 120. The processing element data 150 may include information regarding weights associated with the connections between neural network nodes, decision thresholds for perceptrons, etc.

In an operation 340, using the memory map, the CPU 115 may write the processing element data 150 in contiguous form to the DRAM 120.

In an optional operation 350, the CPU 115 may write input data 140 in contiguous form to the DRAM 120 using the memory map.

In an operation 360, the CPU 115 may initiate operation of the DMA circuitry 105 and the HA circuitry 110.

In an operation 370, using the DMA read/write instructions written to the DRAM 120, the DMA circuitry 105 may read the contiguous processing element data 150 and send the contiguous processing element data 150 to the HA circuitry 110. The contiguous processing element data 150 may be stored in the SRAM 170 after being received by the HA circuitry 110.

In an optional operation 380, using the DMA read/write instructions written to the DRAM 120, the DMA circuitry 105 may read the contiguous input data 140 and send the contiguous input data 140 to the HA circuitry 110. The contiguous input data 140 may be stored in the SRAM 170 after being received by the HA circuitry 110.

In an operation 390, using the DMA read/write instructions written to the DRAM 120, the DMA circuitry 105 may write neural network processing results from the HA circuitry 110 to the DRAM 120 as contiguous output data 145. The output data 145 may also be referred to as layer data. The neural network processing results may be retrieved from the SRAM 170 of the HA circuitry 110 to be transferred by the DMA circuitry 105 to the DRAM 120.

Following operation 390, the method may continue in an iterative loop with operations 370-390 repeated until neural network processing is complete. The neural network processing may be considered complete when the entire neural network topology has been processed.

Modules, Components and Logic

Certain embodiments are described herein as including logic or a number of components, modules, or mechanisms. Modules may constitute either software modules (e.g., code embodied (1) on a non-transitory machine-readable medium or (2) in a transmission signal) or hardware-implemented modules. A hardware-implemented module is tangible unit capable of performing certain operations and may be configured or arranged in a certain manner. In example embodiments, one or more computer systems (e.g., a standalone, client or server computer system) or one or more processors may be configured by software (e.g., an application or application portion) as a hardware-implemented module that operates to perform certain operations as described herein.

In various embodiments, a hardware-implemented module may be implemented mechanically or electronically. For example, a hardware-implemented module may comprise dedicated circuitry or logic that is permanently configured (e.g., as a special-purpose processor, such as an FPGA or an ASIC) to perform certain operations. A hardware-implemented module may also comprise programmable logic or circuitry (e.g., as encompassed within a general-purpose processor or other programmable processor) that is temporarily configured by software to perform certain operations. It will be appreciated that the decision to implement a hardware-implemented module mechanically, in dedicated and permanently configured circuitry, or in temporarily configured circuitry (e.g., configured by software) may be driven by cost and time considerations.

Accordingly, the term "hardware-implemented module" should be understood to encompass a tangible entity, be that an entity that is physically constructed, permanently configured (e.g., hardwired) or temporarily or transitorily configured (e.g., programmed) to operate in a certain manner and/or to perform certain operations described herein. Considering embodiments in which hardware-implemented modules are temporarily configured (e.g., programmed), each of the hardware-implemented modules need not be configured or instantiated at any one instance in time. For example, where the hardware-implemented modules comprise a general-purpose processor configured using software, the general-purpose processor may be configured as respective different hardware-implemented modules at different times. Software may accordingly configure a processor, for example, to constitute a particular hardware-implemented module at one instance of time and to constitute a different hardware-implemented module at a different instance of time.

Hardware-implemented modules may provide information to, and receive information from, other hardware-implemented modules. Accordingly, the described hardware-implemented modules may be regarded as being communicatively coupled. Where multiple of such hardware-implemented modules exist contemporaneously, communications may be achieved through signal transmission (e.g., over appropriate circuits and buses) that connect the hardware-implemented modules. In embodiments in which multiple hardware-implemented modules are configured or instantiated at different times, communications between such hardware-implemented modules may be achieved, for example, through the storage and retrieval of information in memory structures to which the multiple hardware-implemented modules have access. For example, one hardware-implemented module may perform an operation, and store the output of that operation in a memory device to which it is communicatively coupled. A further hardware-implemented module may then, at a later time, access the memory device to retrieve and process the stored output. Hardware-implemented modules may also initiate communications with input or output devices, and may operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., Application Program Interfaces (APIs).)

Electronic Apparatus and System

Example embodiments may be implemented in digital electronic circuitry, or in computer hardware, firmware, software, or in combinations of them. Example embodiments may be implemented using a computer program product, e.g., a computer program tangibly embodied in an information carrier, e.g., in a machine-readable medium for execution by, or to control the operation of, data processing apparatus, e.g., a programmable processor, a computer, or multiple computers.

A computer program may be written in any form of programming language, including compiled or interpreted languages, and it may be deployed in any form, including as a stand-alone program or as a module, subroutine, or other unit suitable for use in a computing environment. A computer program may be deployed to be executed on one computer or on multiple computers at one site or distributed across multiple sites and interconnected by a communication network.

In example embodiments, operations may be performed by one or more programmable processors executing a computer program to perform functions by operating on input data and generating output. Method operations may also be performed by, and apparatus of example embodiments may be implemented as, special purpose logic circuitry, e.g., an FPGA or an ASIC.

The computing system may include clients and servers. A client and server are generally remote from each other and typically interact through a communication network. The relationship of client and server arises by virtue of computer programs running on the respective computers and having a client-server relationship to each other. In embodiments deploying a programmable computing system, it will be appreciated that that both hardware and software architectures require consideration. Specifically, it will be appreciated that the choice of whether to implement certain functionality in permanently configured hardware (e.g., an ASIC), in temporarily configured hardware (e.g., a combination of software and a programmable processor), or a combination of permanently and temporarily configured hardware may be a design choice.

Although an embodiment has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the claims, along with the full range of equivalents to which such claims are entitled.

What is claimed is:

1. A dynamically adaptive neural network processing system comprising:
    memory to store a multi-level linked list and instructions determined based on the multi-level linked list in contiguous blocks of the memory, the instructions representing a neural network, the multi-level linked list including a first linked list representing a topology of the neural network and interconnections between neurons thereof, a second linked list indicating a memory location of the memory from which to begin transferring data to hardware acceleration (HA) circuitry in forward propagation of the neural network, and a third linked list including a starting memory address for each layer of the neural network in reverse order;
    hardware acceleration (HA) circuitry, the HA circuitry to execute the instructions to implement the neural network;
    direct memory access (DMA) circuitry to transfer the instructions from the contiguous blocks of the memory to the HA circuitry; and
    a central processing unit (CPU) to dynamically modify the multi-level linked list during execution of the neural network by the HA circuitry and to generate the instructions in the contiguous blocks of the memory based on the multi-level linked list.

2. The system of claim 1, wherein the DMA circuitry is further to transfer the instructions in the contiguous blocks of the memory corresponding to the modified multi-level linked list to the HA circuitry while the HA circuitry executes the neural network.

3. The system of claim 1, wherein the DMA circuitry is further to transfer results of executing the neural network from the HA circuitry to the memory as contiguous data.

4. The system of claim 1, wherein the CPU converts the multi-level linked list into a sequential array of neural instructions and/or data and the DMA circuitry is further to transfer the sequential array of neural instructions and/or data from the memory to the HA circuitry.

5. The system of claim 4, wherein the HA circuitry includes a plurality of parallel processing elements to process in parallel a corresponding plurality of sequential blocks of the sequential array of neural instructions and/or data as organized by the CPU.

6. The system of claim 1, wherein the HA circuitry includes static random access memory (SRAM) circuitry configured to store results of executing one layer of the neural network to be input to a next layer of the neural network executed by the HA circuitry.

7. A method of executing a dynamically adaptive neural network, the method comprising:
    creating and storing, by a central processing unit (CPU), a multi-level linked list and instructions determined based on the multi-level linked list in contiguous blocks of memory, the instructions representing a neural network, the multi-level linked list including a first linked list representing a topology of the neural network and interconnections between neurons thereof, a second linked list indicating a memory location of the memory from which to begin transferring data to hardware acceleration (HA) circuitry in forward propagation of the neural network, and a third linked list including a starting memory address for each layer of the neural network in reverse order;
    transferring, by direct memory access (DMA) circuitry, the instructions from the contiguous blocks of the memory to hardware acceleration (HA) circuitry;
    executing, by the HA circuitry, the neural network the instructions to implement the neural network;
    dynamically modifying the multi-level linked list during execution of the neural network by the HA circuitry to perform machine learning; and
    generating the instructions in the contiguous blocks of the memory, by the CPU, based on the multi-level linked list.

8. The method of claim 7, further comprising transferring the instructions in the contiguous blocks of the memory corresponding to the modified multi-level linked list to the HA circuitry while the HA circuitry executes the neural network.

9. The method of claim 7, further comprising transferring neural network execution results, by the DMA circuitry, from the HA circuitry to the memory as contiguous data.

10. The method of claim 7, wherein the transferring comprises:
    converting, by the CPU, the multi-level linked list into a sequential array of neural instructions and/or data; and
    transferring, by the DMA circuitry, the sequential array of neural instructions and/or data from the contiguous blocks of the memory to the HA circuitry.

11. The method of claim 10, wherein the executing the neural network comprises:
    organizing, by the CPU, the sequential array of neural instructions and/or data into a plurality of sequential blocks; and
    processing in parallel, by a plurality of parallel processing elements of the HA circuitry, the plurality of sequential blocks of the sequential array of neural instructions and/or data.

12. The method of claim 7, wherein the executing comprises storing, by the HA circuitry, results of executing one layer of the neural network to be input to a next layer of the neural network in static random access memory (SRAM) circuitry of the HA circuitry.

13. The method of claim 7, wherein the multi-level linked list includes read/write instructions for the DMA circuitry, and the transferring is according to the read/write instructions included in the multi-level linked list.

14. At least one non-transitory machine-readable medium including instructions that, when executed by a machine, cause the machine to perform the following operations:
- creating and storing, by a central processing unit (CPU), a multi-level linked list and instructions determined based on the multi-level linked list in contiguous blocks of memory, the instructions representing a neural network, the multi-level linked list including a first linked list representing a topology of the neural network and interconnections between neurons thereof, a second linked list indicating a memory location of the memory from which to begin transferring data to hardware acceleration (HA) circuitry in forward propagation of the neural network, and a third linked list including a starting memory address for each layer of the neural network in reverse order;
- transferring, by direct memory access (DMA) circuitry, the instructions in the contiguous blocks of the memory to hardware acceleration (HA) circuitry;
- executing, by the HA circuitry, the instructions to implement the neural network;
- dynamically modifying the multi-level linked list, by the CPU, during execution of the neural network by the HA circuitry to perform machine learning; and
- generating the instructions in the contiguous blocks of the memory, by the CPU, based on the multi-level linked list.

15. The non-transitory machine-readable medium of claim 14, further including instructions that, when executed by the machine, cause the machine to perform the operation of transferring the instructions in the contiguous blocks of the memory corresponding to the modified multi-level linked list to the HA circuitry while the HA circuitry executes the neural network.

16. The non-transitory machine-readable medium of claim 14, further including instructions that, when executed by the machine, cause the machine to perform the operation of transferring neural network execution results, by the DMA circuitry, from the HA circuitry to the memory as contiguous data.

17. The non-transitory machine-readable medium of claim 14, wherein the operation of transferring comprises:
- converting, by the CPU, the multi-level linked list into a sequential array of neural instructions and/or data; and
- transferring, by the DMA circuitry, the sequential array of neural instructions and/or data from the contiguous blocks of the memory to the HA circuitry.

18. The non-transitory machine-readable medium of claim 17, wherein the operation of executing the deep neural network comprises:
- organizing, by the CPU, the sequential array of neural instructions and/or data into a plurality of sequential blocks; and
- processing in parallel, by a plurality of parallel processing elements of the HA circuitry, the plurality of sequential blocks of the sequential array of neural instructions and/or data.

19. The non-transitory machine-readable medium of claim 14, wherein the operation of executing the neural network comprises storing, by the HA circuitry, results of executing one layer of the neural network to be input to a next layer of the neural network in static random access memory (SRAM) circuitry of the HA circuitry.

20. The non-transitory machine-readable medium of claim 14, wherein the multi-level linked list includes read/write instructions for the DMA circuitry, and the transferring is according to the read/write instructions included in the multi-level linked list.

* * * * *

UNITED STATES PATENT AND TRADEMARK OFFICE
CERTIFICATE OF CORRECTION

| | | |
|---|---|---|
| PATENT NO. | : 10,872,290 B2 | Page 1 of 1 |
| APPLICATION NO. | : 15/711457 | |
| DATED | : December 22, 2020 | |
| INVENTOR(S) | : Goulding et al. | |

It is certified that error appears in the above-identified patent and that said Letters Patent is hereby corrected as shown below:

In the Drawings

Sheet 3 of 4, Fig. 3, reference numeral 390, line 1, delete "NENTWORK" and insert --NETWORK-- therefor In the Specification In Column 2, Line 67, after "first linked list", insert --130A--

In Column 3, Line 10, after "second linked list", insert --130B--

In Column 3, Line 12, after "second linked list", insert --130B--

In Column 3, Line 15, after "second linked list", insert --130B--

In Column 3, Line 18, after "third linked list", insert --130C--

In Column 3, Line 19, after "third linked list", insert --130C--

Signed and Sealed this
Twenty-second Day of February, 2022

Drew Hirshfeld
*Performing the Functions and Duties of the*
*Under Secretary of Commerce for Intellectual Property and*
*Director of the United States Patent and Trademark Office*